(12) United States Patent
Schaffer et al.

(10) Patent No.: US 8,377,737 B1
(45) Date of Patent: Feb. 19, 2013

(54) METHODS OF SHORT WAVELENGTH LASER SCRIBING OF A THIN FILM PHOTOVOLTAIC DEVICE

(75) Inventors: William J. Schaffer, Atascadero, CA (US); Luke W. Jacobson, Arvada, CO (US); Scott L. French, Superior, CO (US); Eric Boese, Westminster, CO (US); Robert A. Garber, Denver, CO (US)

(73) Assignee: Primestar Solar, Inc., Arvada, CO (US)

( * ) Notice: Subject to any disclaimer, the term of this patent is extended or adjusted under 35 U.S.C. 154(b) by 0 days.

(21) Appl. No.: 13/308,367

(22) Filed: Nov. 30, 2011

(51) Int. Cl.
*H01L 21/00* (2006.01)
(52) U.S. Cl. ................ 438/86; 438/85; 438/95
(58) Field of Classification Search ............ 438/85, 438/86, 95
See application file for complete search history.

(56) References Cited

U.S. PATENT DOCUMENTS

| | | | |
|---|---|---|---|
| 4,303,824 A | 12/1981 | Morgan et al. | |
| 4,547,836 A | 10/1985 | Anthony | |
| 4,892,592 A | 1/1990 | Dickson et al. | |
| 6,596,562 B1 | 7/2003 | Maiz | |
| 6,787,732 B1 | 9/2004 | Xuan et al. | |
| 7,169,687 B2 | 1/2007 | Li et al. | |
| 2002/0011641 A1 | 1/2002 | Oswald et al. | |
| 2002/0117199 A1 | 8/2002 | Oswald et al. | |
| 2003/0029848 A1 | 2/2003 | Borgeson et al. | |
| 2003/0124771 A1 | 7/2003 | Maiz | |
| 2005/0272175 A1 | 12/2005 | Meier et al. | |
| 2008/0251126 A1* | 10/2008 | Yamazaki et al. ............ 136/261 |
| 2012/0074109 A1* | 3/2012 | Zhang et al. ............ 219/121.72 |

FOREIGN PATENT DOCUMENTS
WO WO 2009/027476 3/2009

* cited by examiner

*Primary Examiner* — Alexander Ghyka
(74) *Attorney, Agent, or Firm* — Dority & Manning, P.A.

(57) ABSTRACT

Methods for isolating thin film photovoltaic cells on a superstrate are provided. The method includes focusing a laser beam onto a first surface of the superstrate to remove a thin film stack positioned on a second surface of the superstrate, and directing the laser beam across the first surface of the superstrate to form an isolation scribe that is substantially free from the thin film stack. The thin film stack can include a transparent conductive oxide layer on the second surface, an n-type window layer on the transparent conductive oxide layer, and an absorber layer on the n-type window layer. The laser beam can have a laser wavelength of about 370 nm or less, and/or can have a laser wavelength such that the transparent conductive oxide layer absorbs at least about 80% of the laser beam at the laser wavelength.

19 Claims, 3 Drawing Sheets

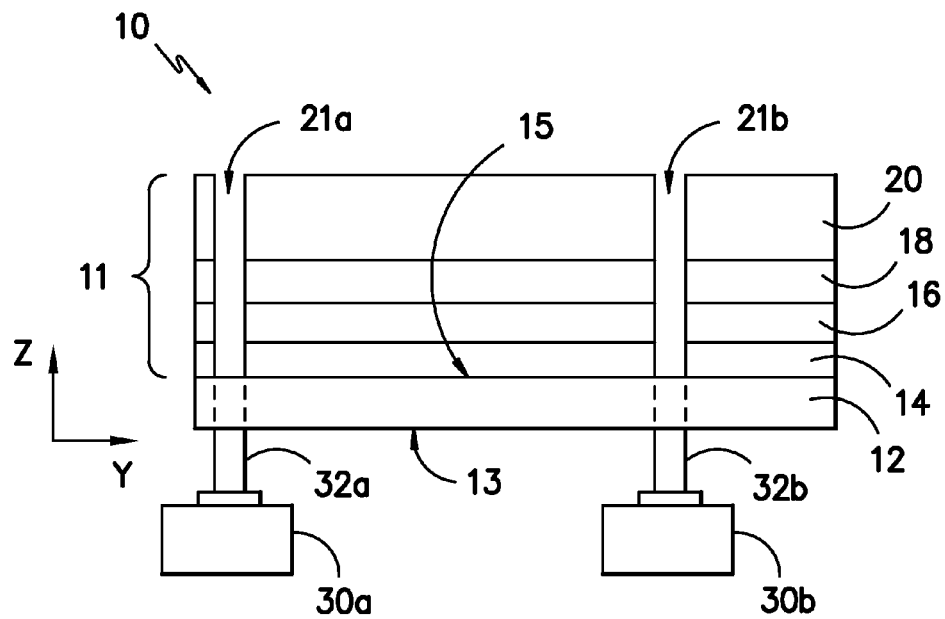
FIG. -1-
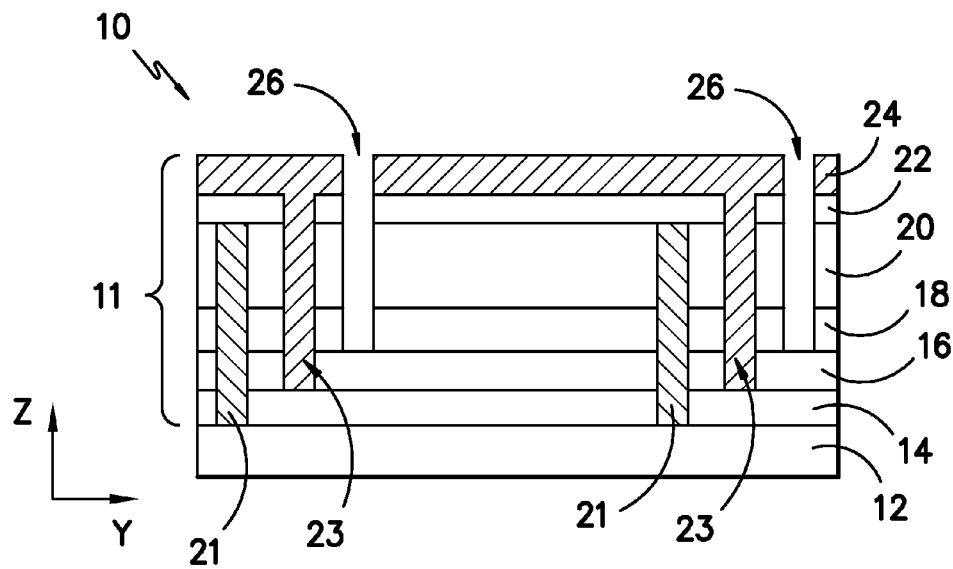
FIG. -2-

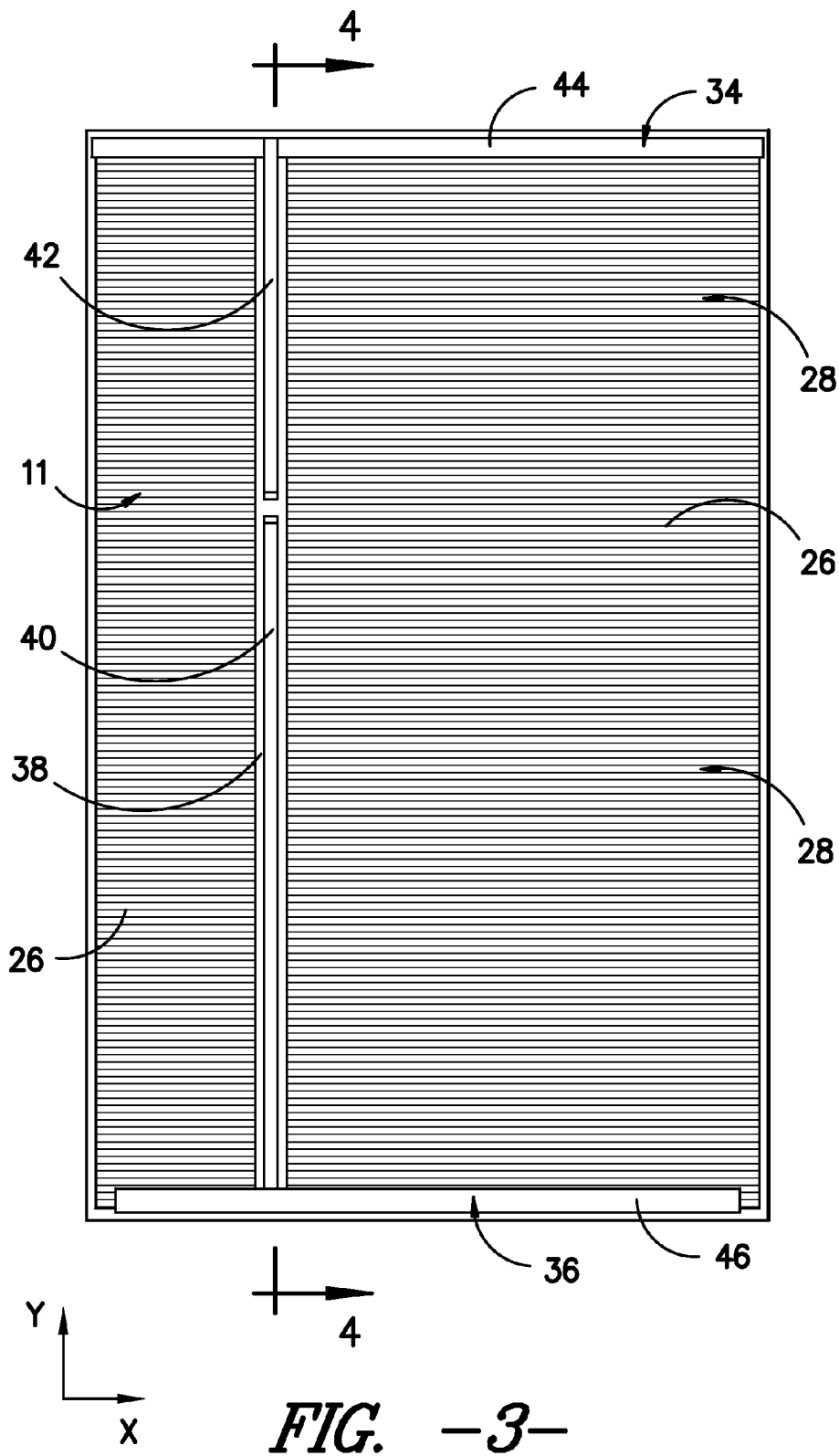
FIG. -3-

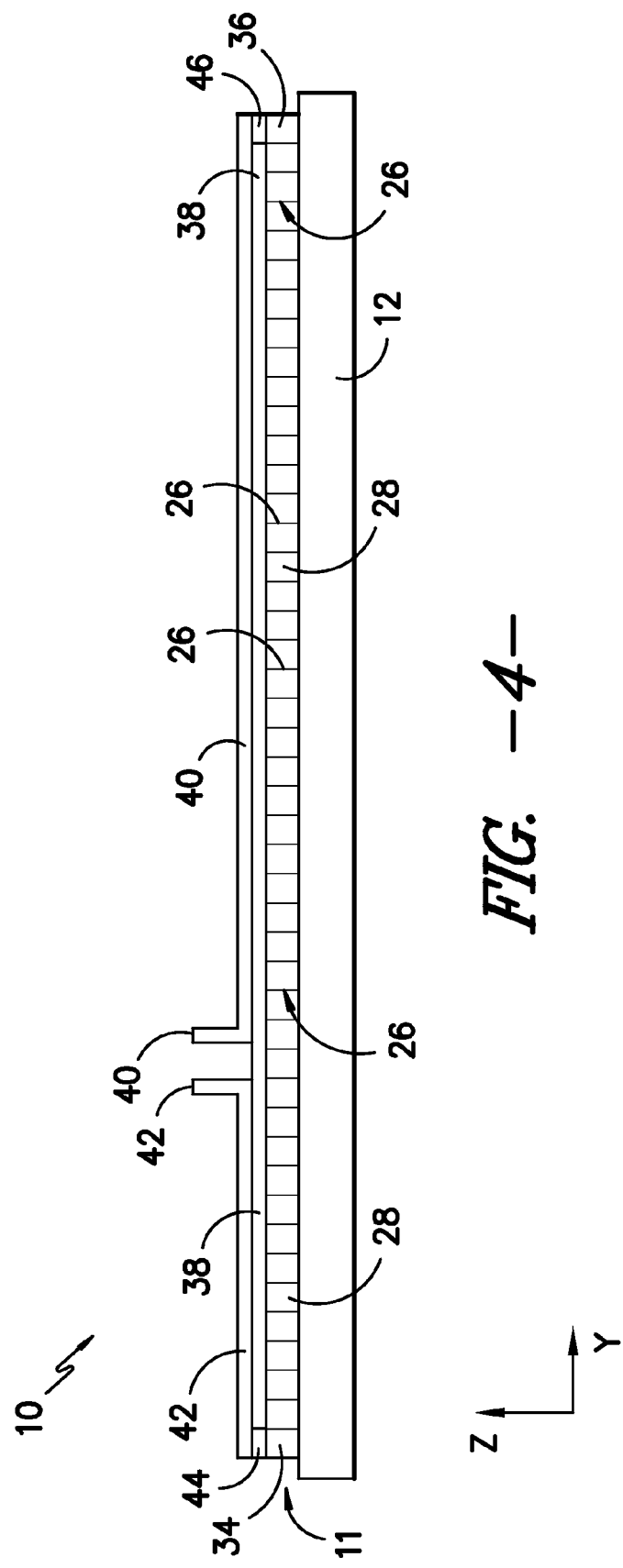
FIG. -4-

METHODS OF SHORT WAVELENGTH LASER SCRIBING OF A THIN FILM PHOTOVOLTAIC DEVICE

FIELD OF THE INVENTION

The subject matter disclosed herein relates generally to methods of scribing thin film layers to form photovoltaic cells. More particularly, the subject matter disclosed herein relates to methods of forming cadmium telluride thin film photovoltaic devices via the use of short wavelength laser scribing.

BACKGROUND OF THE INVENTION

Thin film photovoltaic (PV) modules (also referred to as "solar panels") based on cadmium telluride (CdTe) paired with cadmium sulfide (CdS) as the photoreactive components are gaining wide acceptance and interest in the industry. CdTe is a semiconductor material having characteristics particularly suited for conversion of solar energy to electricity. For example, CdTe has an energy bandgap of about 1.45 eV, which enables it to convert more energy from the solar spectrum as compared to lower bandgap semiconductor materials historically used in solar cell applications (e.g., about 1.1 eV for silicon). Also, CdTe converts radiation energy in lower or diffuse light conditions as compared to the lower bandgap materials and, thus, has a longer effective conversion time over the course of a day or in cloudy conditions as compared to other conventional materials. The junction of the n-type layer and the p-type layer is generally responsible for the generation of electric potential and electric current when the CdTe PV module is exposed to light energy, such as sunlight. Specifically, the cadmium telluride (CdTe) layer and the cadmium sulfide (CdS) form a p-n heterojunction, where the CdTe layer acts as a p-type layer (i.e., an electron accepting layer) and the CdS layer acts as a n-type layer (i.e., an electron donating layer).

A transparent conductive oxide ("TCO") layer is commonly used between the window glass and the junction forming layers. This TCO layer provides the front electrical contact on one side of the device and is used to collect and carry the electrical charge produced by the cell. Conversely, a back contact layer is provided on the opposite side of the junction forming layers and is used as the opposite contact of the cell. This back contact layer is adjacent to the p-type layer, such as the cadmium telluride layer in a CdTe PV device.

In forming the PV module, the thin films are typically scribed to form individual cells. For example, the thin film layers can be isolated up to the absorber layer, including the TCO layer, prior to application of the back contact (i.e., commonly referred to as the "P1 scribe"). Additionally, this scribe can then be filled with a nonconductive material, prior to application of a back contact and/or further scribing. In the case of cadmium telluride PV devices, a laser having a relatively high wavelength (e.g., 1064 nanometers) is typically used to form this isolation P1 scribe. However, such a relatively high wavelength laser can be transparent to commonly used TCO layer materials, and consequentially requires a high amount of power to be used. This higher power can lead to jagged scribe line formed in the thin film layers, which can adversely affect the subsequent filling and/or functionalization of the PV cells.

Thus, a need exists for photovoltaic devices having improved isolation scribe and methods of making the same.

BRIEF DESCRIPTION OF THE INVENTION

Aspects and advantages of the invention will be set forth in part in the following description, or may be obvious from the description, or may be learned through practice of the invention.

Methods are generally provided for isolating thin film photovoltaic cells on a superstrate. For example, the method can include focusing a laser beam onto a first surface of the superstrate to remove a thin film stack positioned on a second surface of the superstrate, and directing the laser beam across the first surface of the superstrate to form an isolation scribe that is substantially free from the thin film stack. The thin film stack can include, but is not limited to, a transparent conductive oxide layer on the second surface, an n-type window layer on the transparent conductive oxide layer, and an absorber layer on the n-type window layer.

In one embodiment, the laser beam can have a laser wavelength of about 370 nm or less. Additionally or alternatively, the laser beam can have a laser wavelength such that the transparent conductive oxide layer absorbs at least about 80% of the laser beam at the laser wavelength.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which:

FIG. 1 shows a general schematic of a cross-sectional view of laser beams scribing an exemplary thin film photovoltaic device;

FIG. 2 shows a general schematic of a cross-sectional view of an exemplary thin film photovoltaic device formed according to one embodiment;

FIG. 3 shows a general schematic of an exemplary thin film photovoltaic device; and, FIG. 4 shows a cross-sectional view of the exemplary thin film photovoltaic device of FIG. 3.

Repeat use of reference characters in the present specification and drawings is intended to represent the same or analogous features or elements.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

In the present disclosure, when a layer is being described as "on" or "over" another layer or substrate, it is to be understood that the layers can either be directly contacting each other or have another layer or feature between the layers, unless otherwise stated. Thus, these terms are simply describing the relative position of the layers to each other and do not necessarily mean "on top of" since the relative position above or below depends upon the orientation of the device to the viewer. Additionally, although the invention is not limited to any particular film thickness, the term "thin" describing any film layers of the photovoltaic device generally refers to the film layer having a thickness less than about 10 micrometers ("microns" or "μm").

It is to be understood that the ranges and limits mentioned herein include all ranges located within the prescribed limits (i.e., subranges). For instance, a range from about 100 to about 200 also includes ranges from 110 to 150, 170 to 190, 153 to 162, and 145.3 to 149.6. Further, a limit of up to about 7 also includes a limit of up to about 5, up to 3, and up to about 4.5, as well as ranges within the limit, such as from about 1 to about 5, and from about 3.2 to about 6.5.

Methods are generally provided for isolating thin film photovoltaic cells on a superstrate, along with the resulting photovoltaic devices. In one embodiment, a laser beam can be focused onto a first surface of the superstrate to remove a thin film stack positioned on a second surface of the superstrate. The laser beam can be directed across the first surface of the superstrate to form an isolation scribe that is substantially free from the thin film stack. As such, isolated photovoltaic cells can be formed in the thin film stack.

Referring to FIG. 1, a photovoltaic device 10 is generally shown having a thin film stack 11. Laser sources 30a, 30b are shown focusing a laser beam 32a, 32b, respectively, onto a first surface 13 of the superstrate 12. The laser beams 32a, 32b pass through the superstrate 12 to remove the thin film stack 11 on the second surface 15 of the superstrate 12 to form isolation scribes 21a, 21b, respectively. In the embodiment shown, the thin film stack 11 includes a transparent conductive oxide layer 14 on the second surface 15, an optional resistive transparent buffer layer 16 on the transparent conductive oxide layer 14, an n-type window layer 18 on the transparent conductive oxide layer 14, and an absorber layer 20 on the n-type window layer 18.

As stated, the laser beams 32a, 32b can generally have relatively low wavelengths (e.g., of about 375 nm or less), which are particularly suitable for removing a TCO layer 14 including a cadmium tin oxide, based on the absorption of such a layer at such wavelengths. In one embodiment, the laser beams 32a, 32b can have a laser wavelength of about 330 nm to about 370 nm. For example, the laser beams 32a, 32b can have a laser wavelength of about 345 to about 360 nm (e.g., about 355). At such relatively low wavelengths, the thin film stack 11 can be removed completely in a quick manner due to the absorption of the light energy (i.e., the laser beams 32a, 32b) at these wavelengths by the transparent conductive oxide layer 14. For example, the transparent conductive oxide layer 14 can have at least 80% absorption of the laser beam 32 at the laser wavelength (e.g., about 85% to about 95%). For instance, in one particular embodiment, the transparent conductive oxide layer 14 can include a cadmium tin oxide (e.g., cadmium stannate or a stoichiometric variation thereof).

The relatively high absorption of the laser beams 32a, 32b at these relatively low light wavelengths by the transparent conductive oxide layer 14 can cause the transparent conductive oxide layer 14 to heat quickly, to the point of exploding off of the second surface 15 of the superstrate 12. The explosion of the transparent conductive oxide layer 14 from the second surface 15 of the superstrate 12 provides enough force to also remove any and all thin film layers thereon (e.g., the optional resistive transparent buffer layer 16, the n-type window layer 18, and the absorber layer 20).

Additionally, it is believed, without wishing to be bound by any particular theory, that this method can produce a more uniform scribe 21 through the thin film stack 11, such as having a less jagged edge, when compared to using a higher wavelength laser beam.

FIG. 2 shows a cross-section of an exemplary thin film photovoltaic device 10 that can be formed using the relatively short wavelength laser beam to form the isolation scribe 21. The device 10 is shown including the superstrate 12, the transparent conductive oxide ("TCO") layer 14, the optional resistive transparent buffer ("RTB") layer 16, the n-type window layer 18 (e.g., a cadmium sulfide layer), the absorber layer 20 (e.g., a cadmium telluride layer), a graphite layer 22, and a metal contact layer 24. Collectively, the graphite layer 22 and metal contact layer 24 make up the back contact of the device 10. It is, however, to be understood that other material combinations could instead be used to form the back contact and that such combinations are considered to be within the scope of presently disclosed device.

As shown in FIG. 2, the photovoltaic device 10 generally includes a plurality of photovoltaic cells 28 separated by scribe lines 21, 23, 26, generally formed via a laser scribing process. For example, the laser scribing process can entail defining a first isolation scribe 21 (also know as a "P1 scribe") from the substrate 12 through the photo reactive layers (i.e., the n-type window layer 18 and the absorber layer 20), including the underlying layers (i.e., through the TCO layer 14), as discussed above using a relatively short wavelength laser (e.g., having a wavelength of about 370 nm or less). The first isolation scribe line 21 can then be filled with dielectric material before application of the back contact layers 22, 24 in order to ensure that the TCO layer 14 is electrically isolated between cells 28. For example, the first isolation scribe 21 can be filled using a photoresist development process wherein a liquid negative photoresist (NPR) material is coated onto the absorber layer 20 by spraying, roll coating, screen printing, or any other suitable application process. The substrate 12 is then exposed to light from below such that the NPR material in the first isolation scribes 21 (and any pinholes in the absorber material 20) are exposed to the light, causing the exposed NPR polymers to crosslink and "harden." The substrate 12 can then be "developed" in a process wherein a chemical developer is applied to the absorber layer 20 to dissolve any unhardened NPR material. In other words, the NPR material that was not exposed to the light is washed away from the absorber layer 20 by the developer, leaving the first isolation scribes 21 filled with the NPR material.

This technology (i.e., a transparent conductive oxide layer 14 that includes a cadmium tin oxide, especially in conjunction with a cadmium telluride (CdTe) absorber layer) requires a complete NPR (insulating) process after formation of the first isolation scribe (i.e., the P1 scribe). For the "exposure" step in the NPR process, the requirement is to leave behind a vertical CdTe sidewall. The perception is that all of the transparent conductive oxide layer 14 has to be completely removed from the bottom of the scribe to avoid a "ledge" at the bottom corners, however, it is believed that this may be true for $SnO_2$, but not necessarily for a transparent conductive oxide layer 14 that includes a cadmium tin oxide. As such, the presently disclosed method for removing all of the TCO layer 14 and leave the absorber layer (e.g., CdTe) edges vertical is to work "through the glass" and at a wavelength that is preferentially absorbed in the TCO layer 14 at interface of the TCO layer 14 and the superstrate 12 in order to fracture the overlayers (e.g., up to the absorber layer 20) off by blowing up the TCO layer 14 at the superstrate 12 interface). When formed from a cadmium tin oxide, the absorption spectrum of the TCO layer 14 suggests a wavelength less than 375 nm would be particularly suitable (e.g., less than 370 nm). When used with a boro-silicate glass as the superstrate 12, the absorption spectrum of the boro-silicate glass suggests a wavelength of greater than 330 nm. However, these particular wavelengths would not be suitable for soda lime glass acting as the superstrate 12.

As such, a wavelength range of between about 330 and about 375 nm for the first series isolation scribe (i.e., the P1 scribe) process is particular suitable only because of the combination of a TCO layer 14 that includes a cadmium tin oxide, and the use of a boro-silicate glass as the superstrate 12, and the NPR requirement to fill the scribe.

In one embodiment, after filling the first isolation scribes 21, the graphite layer 22 can be applied onto the absorber layer 20.

A series connecting scribe 23 (also known as a "P2 scribe") can then be laser cut through the graphite layer 22 to the TCO layer 14 and filled with the conductive metallic material of the metal contact layer 24 to electrically connect adjacent cells to each other in series. Of course, any conductive material can be included in the series connecting scribes 23. Specifically, the series connecting scribe 23 can allow the metal contact layer 24 to contact the TCO layer 14 providing a direct electrical connection between the back contact (e.g., the graphite layer 22 and the metal contact layer 24) and the front contact material (i.e., the TCO layer 14).

Finally, a second isolation scribe 26 can be laser cut through the back contact (i.e., the graphite layer 22 and the metal contact layer 24) and photo reactive layers (i.e., the n-type window layer 18 and the absorber layer 20) to isolate the back contact into individual cells.

As stated, the exemplary device 10 of FIGS. 1-2 includes superstrate 12 employed as the substrate on which the subsequent layers are formed, but it faces upwards to the radiation source (e.g., the sun) when the thin film photovoltaic device 10 is in used. The superstrate 12 can be a high-transmission glass (e.g., high transmission borosilicate glass), low-iron float glass, or other highly transparent glass material. The glass is generally thick enough to provide support for the subsequent film layers (e.g., from about 0.5 mm to about 10 mm thick), and is substantially flat to provide a good surface for forming the subsequent film layers. In one embodiment, the superstrate 12 can be a borosilicate glass having a thickness of about 0.5 mm to about 2.5 mm. When using a boro-silicate glass as the superstrate 12, the absorption spectra suggests that wavelengths of greater than about 330 nm are particularly suitable. As such, a laser beam having a wavelength of about 330 nm to about 370 nm can be particularly suitable for use with the combination of a borosilicate glass as the superstrate 12 with a TCO layer comprising a cadmium tin oxide (e.g., about 330 nm to about 365 nm, such as about 345 nm to about 360 nm).

The transparent conductive oxide (TCO) layer 14 is shown on the superstrate 12 of the exemplary device 10. The TCO layer 14 allows light to pass through with minimal absorption while also allowing electric current produced by the device 10 to travel sideways to opaque metal conductors (not shown). For instance, the TCO layer 14 can have a sheet resistance less than about 30 ohm per square, such as from about 4 ohm per square to about 20 ohm per square (e.g., from about 8 ohm per square to about 15 ohm per square). The TCO layer 14 generally includes at least one conductive oxide, such as tin oxide, zinc oxide, or indium tin oxide, or mixtures thereof. Additionally, the TCO layer 14 can include other conductive, transparent materials. The TCO layer 14 can also include zinc stannate and/or cadmium stannate.

The TCO layer 14 can be formed by sputtering, chemical vapor deposition, spray pyrolysis, or any other suitable deposition method. In one particular embodiment, the TCO layer 14 can be formed by sputtering, either DC sputtering or RF sputtering, on the substrate 12. For example, a cadmium stannate layer can be formed by sputtering a hot-pressed target containing stoichiometric amounts of $SnO_2$ and CdO onto the substrate 12 in a ratio of about 1 to about 2. The cadmium stannate can alternatively be prepared by using cadmium acetate and tin (II) chloride precursors by spray pyrolysis.

In certain embodiments, the TCO layer 14 can have a thickness between about 0.1 μm and about 1 μm, for example from about 0.1 μm to about 0.5 μm, such as from about 0.25 μm to about 0.35 μm.

The optional resistive transparent buffer layer 16 (RTB layer) is shown on the TCO layer 14 on the exemplary thin film photovoltaic device 10. The RTB layer 16 is generally more resistive than the TCO layer 14 and can help protect the device 10 from chemical interactions between the TCO layer 14 and the subsequent layers during processing of the device 10. For example, in certain embodiments, the RTB layer 16 can have a sheet resistance that is greater than about 1000 ohms per square, such as from about 10 kOhms per square to about 1000 MOhms per square. The RTB layer 16 can also have a wide optical bandgap (e.g., greater than about 2.5 eV, such as from about 2.7 eV to about 3.0 eV).

Without wishing to be bound by a particular theory, it is believed that the presence of the RTB layer 16 between the TCO layer 14 and the n-type window layer 18 can allow for a relatively thin n-type window layer 18 to be included in the device 10 by reducing the possibility of interface defects (i.e., "pinholes" in the n-type window layer 18) creating shunts between the TCO layer 14 and the absorber layer 20. Thus, it is believed that the RTB layer 16 allows for improved adhesion and/or interaction between the TCO layer 14 and the absorber layer 20, thereby allowing a relatively thin n-type window layer 18 to be formed thereon without significant adverse effects that would otherwise result from such a relatively thin n-type window layer 18 formed directly on the TCO layer 14.

The RTB layer 16 can include, for instance, a combination of zinc oxide (ZnO) and tin oxide ($SnO_2$), which can be referred to as a zinc tin oxide layer ("ZTO"). In one particular embodiment, the RTB layer 16 can include more tin oxide than zinc oxide. For example, the RTB layer 16 can have a composition with a stoichiometric ratio of $ZnO/SnO_2$ between about 0.25 and about 3, such as in about an one to two (1:2) stoichiometric ratio of tin oxide to zinc oxide. The RTB layer 16 can be formed by sputtering, chemical vapor deposition, spraying pryolysis, or any other suitable deposition method. In one particular embodiment, the RTB layer 16 can be formed by sputtering, either DC sputtering or RF sputtering, on the TCO layer 14. For example, the RTB layer 16 can be deposited using a DC sputtering method by applying a DC current to a metallic source material (e.g., elemental zinc, elemental tin, or a mixture thereof) and sputtering the metallic source material onto the TCO layer 14 in the presence of an oxidizing atmosphere (e.g., $O_2$ gas). When the oxidizing atmosphere includes oxygen gas (i.e., $O_2$), the atmosphere can be greater than about 95% pure oxygen, such as greater than about 99%.

In certain embodiments, the RTB layer 16 can have a thickness between about 0.075 μm and about 1 μm, for example from about 0.1 μm to about 0.5 μm. In particular embodiments, the RTB layer 16 can have a thickness between about 0.08 μm and about 0.2 μm, for example from about 0.1 μm to about 0.15 μm.

The n-type window layer 18 is shown on resistive transparent buffer layer 16 of the exemplary device 10. In one particular embodiment, the n-type window layer 18 can generally includes cadmium sulfide (CdS) but may also include other materials, such as zinc sulfide, cadmium zinc sulfide, etc., and mixtures thereof as well as dopants and other impurities. As such, the n-type window layer 18 may be referred to as a cadmium sulfide layer, when primarily composed of cadmium sulfide. In one particular embodiment, the cadmium sulfide layer may include oxygen up to about 25% by atomic percentage, for example from about 5% to about 20% by atomic percentage. The n-type window layer 18 can have a wide band gap (e.g., from about 2.25 eV to about 2.5 eV, such as about 2.4 eV) in order to allow most radiation energy (e.g., solar radiation) to pass. As such, the n-type window layer 18 is considered a transparent layer on the device 10.

The n-type window layer 18 can be formed by sputtering, chemical vapor deposition, chemical bath deposition, and other suitable deposition methods. In one particular embodiment, the n-type window layer 18 can be formed by sputtering, either direct current (DC) sputtering or radio frequency (RF) sputtering, on the resistive transparent buffer layer 16. Sputtering deposition generally involves ejecting material from a target, which is the material source, and depositing the ejected material onto the substrate to form the film. DC sputtering generally involves applying a voltage to a metal target (i.e., the cathode) positioned near the substrate (i.e., the anode) within a sputtering chamber to form a direct-current discharge. The sputtering chamber can have a reactive atmosphere (e.g., an oxygen atmosphere, nitrogen atmosphere, fluorine atmosphere) that forms a plasma field between the metal target and the substrate. The pressure of the reactive atmosphere can be between about 1 mTorr and about 20 mTorr for magnetron sputtering. When metal atoms are released from the target upon application of the voltage, the metal atoms can react with the plasma and deposit onto the surface of the substrate. For example, when the atmosphere contains oxygen, the metal atoms released from the metal target can form a metallic oxide layer on the substrate. Conversely, RF sputtering generally involves exciting a capacitive discharge by applying an alternating-current (AC) or radio-frequency (RF) signal between the target (e.g., a ceramic source material) and the substrate. The sputtering chamber can have an inert atmosphere (e.g., an argon atmosphere) having a pressure between about 1 mTorr and about 20 mTorr.

Due to the presence of the resistive transparent buffer layer 16, the n-type window layer 18 can have a thickness that is less than about 0.1 μm, such as between about 10 nm and about 100 nm, such as from about 50 nm to about 80 nm, with a minimal presence of pinholes between the resistive transparent buffer layer 16 and the n-type window layer 18. Additionally, a n-type window layer 18 having a thickness less than about 0.1 μm reduces any adsorption of radiation energy by the n-type window layer 18, effectively increasing the amount of radiation energy reaching the underlying absorber layer 20.

The absorber layer 20 is a p-type layer that interacts with the n-type window layer 18 (e.g., a cadmium sulfide layer) to produce current from the adsorption of radiation energy by absorbing the majority of the radiation energy passing into the device 10 due to its high absorption coefficient and creating electron-hole pairs. In one particular embodiment, the absorber layer 20 generally includes cadmium telluride (CdTe) but may also include other materials (also referred to as a cadmium telluride layer). For example, the absorber layer 20 can generally be formed from cadmium telluride and can have a bandgap tailored to absorb radiation energy (e.g., from about 1.4 eV to about 1.5 eV, such as about 1.45 eV) to create the maximum number of electron-hole pairs with the highest electrical potential (voltage) upon absorption of the radiation energy. Electrons may travel from the absorber layer 20 (e.g., a cadmium telluride layer) across the junction to the n-type window layer 18 (e.g., a cadmium sulfide layer 18) and, conversely, holes may pass from the n-type window layer 18 to the absorber layer 20. Thus, the p-n junction formed between the n-type window layer 18 and the absorber layer 20 forms a diode in which the charge imbalance leads to the creation of an electric field spanning the p-n junction. Conventional current is allowed to flow in only one direction and separates the light induced electron-hole pairs.

The absorber layer 20 can be formed by any known process, such as vapor transport deposition, chemical vapor deposition (CVD), spray pyrolysis, electro-deposition, sputtering, close-space sublimation (CSS), etc. In one particular embodiment, the n-type window layer 18 is deposited by a sputtering and the absorber layer 20 is deposited by close-space sublimation. In particular embodiments, the absorber layer 20 can have a thickness between about 0.1 μm and about 10 μm, such as from about 1 μm and about 5 μm. In one particular embodiment, the absorber layer 20 can have a thickness between about 2 μm and about 4 μm, such as about 3 μm.

A series of post-forming treatments can be applied to the exposed surface of the absorber layer 20. For example, when the absorber layer 20 includes cadmium telluride, these treatments can tailor the functionality of the cadmium telluride layer 20 and prepare its surface for subsequent adhesion to the back contact layers 22 and 24. For example, the cadmium telluride layer 20 can be annealed at elevated temperatures (e.g., from about 350° C. to about 500° C., such as from about 375° C. to about 424° C.) for a sufficient time (e.g., from about 1 to about 10 minutes) to create a quality p-type layer of cadmium telluride. Without wishing to be bound by theory, it is believed that annealing the cadmium telluride layer 20 (and the device 10) converts the normally n-type cadmium telluride layer 20 to a p-type cadmium telluride layer 20 having a relatively low resistivity. Additionally, the cadmium telluride layer 20 can recrystallize and undergo grain growth during annealing.

Annealing the cadmium telluride layer 20 can be carried out in the presence of cadmium chloride in order to dope the cadmium telluride layer 20 with chloride ions. For example, the cadmium telluride layer 20 can be washed with an aqueous solution containing cadmium chloride then annealed at the elevated temperature.

In one particular embodiment, after annealing the cadmium telluride layer 20 in the presence of cadmium chloride, the surface can be washed to remove any cadmium oxide formed on the surface. This surface preparation can leave a Te-rich surface on the cadmium telluride layer 20 by removing oxides from the surface, such as CdO, $CdTeO_3$, $CdTe_2O_5$, etc. For instance, the surface can be washed with a suitable solvent (e.g., ethylenediamine also known as 1,2 diaminoethane or "DAE") to remove any cadmium oxide from the surface.

Additionally, copper can be added to the cadmium telluride layer 20. Along with a suitable etch, the addition of copper to the cadmium telluride layer 20 can form a surface of copper-telluride on the cadmium telluride layer 20 in order to obtain a low-resistance electrical contact between the cadmium telluride layer 20 (i.e., the p-type layer) and the back contact layer(s). Specifically, the addition of copper can create a surface layer of cuprous telluride ($Cu_2Te$) between the cadmium telluride layer 20 and the back contact layer 22. Thus, the Te-rich surface of the cadmium telluride layer 20 can enhance the collection of current created by the device through lower resistivity between the cadmium telluride layer 20 and the back contact layer 22.

Copper can be applied to the exposed surface of the cadmium telluride layer 20 by any process. For example, copper can be sprayed or washed on the surface of the cadmium telluride layer 20 in a solution with a suitable solvent (e.g., methanol, water, or the like, or combinations thereof) followed by annealing. In particular embodiments, the copper may be supplied in the solution in the form of copper chloride, copper iodide, or copper acetate. The annealing temperature is sufficient to allow diffusion of the copper ions into the cadmium telluride layer 20, such as from about 125° C. to about 300° C. (e.g. from about 150° C. to about 200° C.) for about 5 minutes to about 30 minutes, such as from about 10 to about 25 minutes.

The back contact is formed from the graphite layer 22 and the metal contact layer 24 shown on the absorber layer 20 and generally serves as the back electrical contact, in relation to the opposite, TCO layer 14 serving as the front electrical contact. The back contact is formed on, and in one embodiment is in direct contact with, the cadmium telluride layer 20.

The graphite layer 22 can include a polymer blend or a carbon paste and can be applied to the semiconductor device by any suitable method for spreading the blend or paste, such as screen printing, spraying or by a "doctor" blade. After the application of the graphite blend or carbon paste, the device 10 can be heated to convert the blend or paste into the conductive graphite layer 22. The graphite layer 22 can be, in particular embodiments, from about 0.1 µm to about 10 µm in thickness, for example from about 1 µm to about 5 µm.

The metal contact layer 24 is suitably made from one or more highly conductive materials, such as elemental nickel, chromium, copper, tin, aluminum, gold, silver, technetium or alloys or mixtures thereof. The metal contact layer 24, if made of or comprising one or more metals, is suitably applied by a technique such as sputtering or metal evaporation. The metal contact layer 24 can be from about 0.1 µm to about 1.5 µm in thickness.

Other layers may also be present in the thin film stack 11, although not specifically shown in the embodiment of FIGS. 1 and 2. For example, index matching layers may be present between the transparent conductive oxide layer 14 and the second surface 15 of the superstrate 12. Additionally, an oxygen getter layer may be present in the thin film stack 11, such as adjacent to the transparent conductive oxide layer 14 (e.g., between the transparent conductive oxide layer 14 and the optional resistive transparent buffer layer 16).

Other components (not shown) can be included in the exemplary device 10, such as buss bars, external wiring, laser etches, etc. For example, when the device 10 forms a photovoltaic cell of a photovoltaic module, a plurality of photovoltaic cells can be connected in series in order to achieve a desired voltage, such as through an electrical wiring connection. Each end of the series connected cells can be attached to a suitable conductor such as a wire or bus bar, to direct the photovoltaically generated current to convenient locations for connection to a device or other system using the generated electric. A convenient means for achieving such series connections is to laser scribe the device to divide the device into a series of cells connected by interconnects.

For example, FIGS. 3-4 show an exemplary thin film photovoltaic device 10 that includes a plurality of photovoltaic cells 28 separated by scribe lines 26. It is noted that the scribe lines 26 shown are actually the three scribe lines 21, 23, and 26 discussed above. However, due to the presence of the metal contact layer 24 covering the first isolation scribe 21 and filling the series connecting scribe 23, only the second isolation scribe lines 26 are visible and thus appear to be a single line in the device 10.

As stated, the thin film stack 11 defines individual solar cells 28 (also referred to as photovoltaic cells) separated by scribes 26 to collectively form a plurality of serially connected solar cells. Specifically, the individual photovoltaic cells 28 are electrically connected together in series. The plurality of serially connected solar cells 28 are between a dead cell 34 and a terminal cell 36. As shown, the dead cell 34 and the terminal cell 36 are positioned on opposite ends of the plurality of serially connected solar cells 28 in the y-direction of the device 10. The back contact of the dead cell 34 serves as an electrical connector for the device 10, while the TCO layer of the terminal cell 36 serves as the opposite electrical connector for the device 10. As such, the dead cell 34 does not produce a charge in its the thin film stack 11, while the terminal cell 36 may.

For instance, FIG. 3 generally shows a top view of an exemplary thin film photovoltaic device 10 defining a plurality of photovoltaic cells 28 separated by scribes 26. The scribes 26 can be, in one embodiment, substantially parallel to each other such that the photovoltaic cells 28 are substantially the same size. As shown, each of the scribes 26 is generally oriented in the x-direction.

An insulating layer 38 is on the thin film stack 11 to protect the back contact 22, 24 of the thin film stack 11, as shown in FIG. 1. The insulating layer 38 generally includes an insulating material that can prevent electrical conductivity therethrough. Any suitable material can be used to produce the insulating layer 38. In one embodiment, the insulating layer 38 can be an insulating polymeric film coated on both surfaces with an adhesive coating. The adhesive coating can allow for adhesion of the insulating layer 38 to the underlying thin film stack 11 and for the adhesion of the conductive strip 40, 42 to the insulating layer 38. For example, the insulating layer 38 can include a polymeric film of polyethylene terephthalate (PET) having an adhesive coating on either surface. The adhesive coating can be, for example, an acrylic adhesive, such as a thermosetting acrylic adhesive.

In one particular embodiment, the insulating layer 38 is a strip of insulating material generally oriented in a direction perpendicular to the orientation of the scribes 26. For example, as shown in FIG. 3, the insulating layer 38 can be generally oriented in the y-direction that is perpendicular to the orientation of the scribes 26 in the x-direction.

The insulating layer 38 can have a thickness in the z-direction suitable to prevent electrical conductivity from the underlying thin film layers, particularly the back contact, to any subsequently applied layers. In one particular embodiment, the insulating layer 38 can prevent electrically conductivity between the thin film stack 11 and the conductive strips 40, 42.

The conductive strips 40, 42, in one embodiment, can be applied as a continuous strip over the insulating layer 38, and then severed to produce a first lead 40 and a second lead 42, as shown in FIGS. 3-4. The conductive strips 40, 42 can be constructed from any suitable material. In one particular embodiment, the conductive strips 40, 42 is a strip of metal foil. For example, the metal foil can include a conductive metal.

Bus bars 44, 46 can then be attached over the terminal cell 36 and the dead cell 34, respectively, of the photovoltaic device 10 to serve as an opposite electrical connections. The encapsulating substrate (not shown) can be adhered to the photovoltaic device 10 via an adhesive layer (not shown). The adhesive layer is generally positioned over the conductive strips 40, 42, the insulating layer 38, and any remaining exposed areas of the thin film stack 11. For example, the adhesive layer can define an adhesive gap that generally corresponds to a connection aperture defined by the encapsulating substrate. As such, the first lead 40 and second lead 42 can extend through the adhesive gap. The adhesive layer can generally protect the thin film stack 11 and attach the encapsulating substrate to the device 10. The adhesive layer can be constructed from ethylene vinyl acetate (EVA), polyvinyl butyral (PVB), silicone based adhesives, or other adhesives which are configured to prevent moisture from penetrating the device.

A junction box (not shown) can also be included in the device and can be configured to electrically connect the photovoltaic device 10 by completing the DC circuit.

However, other configurations can be used to form the thin film photovoltaic device 10, such as a three terminal thin film device.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method of isolating thin film photovoltaic cells on a superstrate, the method comprising:
    focusing a laser beam onto a first surface of the superstrate to remove a thin film stack positioned on a second surface of the superstrate, the laser beam having a laser wavelength of about 375 nm or less, wherein the thin film stack comprises a transparent conductive oxide layer comprising a cadmium tin oxide on the second surface, an n-type window layer on the transparent conductive oxide layer, and an absorber layer comprising cadmium telluride on the n-type window layer; and,
    directing the laser beam across the first surface of the superstrate to form an isolation scribe that is substantially free from the thin film stack.

2. The method as in claim 1, wherein the laser beam has a laser wavelength of about 330 nm to about 370 nm.

3. The method as in claim 1, wherein the laser beam has a laser wavelength of about 345 nm to about 360 nm.

4. The method as in claim 1, wherein the laser beam has a laser wavelength of about 355 nm.

5. The method as in claim 1, wherein the superstrate comprises a borosilicate glass.

6. The method as in claim 5, wherein the superstrate has a thickness of about 0.5 mm to about 2.5 mm.

7. The method as in claim 1, wherein the transparent conductive oxide layer has at least 80% absorption of the laser beam at the laser wavelength.

8. The method as in claim 1, wherein the transparent conductive oxide layer has about 85% to about 95% absorption of the laser beam at the laser wavelength.

9. The method as in claim 1, wherein the n-type window layer comprises cadmium sulfide.

10. The method as in claim 1, wherein the thin film stack further comprises a resistive transparent buffer layer between the transparent conductive oxide layer and the n-type window layer.

11. The method as in claim 10, wherein the resistive transparent buffer layer comprises a zinc tin oxide.

12. The method as in claim 1, further comprising:
    filling the scribe line with a nonconductive material.

13. A method of isolating thin film photovoltaic cells on a superstrate, the method comprising:
    focusing a laser beam having a laser wavelength onto a first surface of the superstrate to remove a thin film stack positioned on a second surface of the superstrate, wherein the thin film stack comprises a transparent conductive oxide layer on the second surface, an n-type window layer on the transparent conductive oxide layer, and an absorber layer comprising cadmium telluride on the n-type window layer, wherein the transparent conductive oxide layer absorbs at least about 80% of the laser beam at the laser wavelength; and,
    directing the laser beam across the first surface of the superstrate to form an isolation scribe that is substantially free from the thin film stack.

14. The method as in claim 13, wherein the transparent conductive oxide layer absorbs about 85% to about 99% of the laser beam at the laser wavelength.

15. The method as in claim 13, wherein the transparent conductive oxide layer comprises a cadmium tin oxide.

16. The method as in claim 15, wherein the laser wavelength is about 330 nm to about 370 nm.

17. The method as in claim 16, wherein the laser wavelength is about 345 nm to about 360 nm.

18. The method as in claim 16, wherein the superstrate comprises a borosilicate glass.

19. The method as in claim 18, wherein the superstrate has a thickness of about 0.5 mm to about 2.5 mm.

* * * * *